US011528546B2

(12) United States Patent
Lin et al.

(10) Patent No.: US 11,528,546 B2
(45) Date of Patent: Dec. 13, 2022

(54) SEALED VACUUM MEMS DIE

(71) Applicant: Knowles Electronics, LLC, Itasca, IL (US)

(72) Inventors: Hung Chien Lin, Naperville, IL (US); Richard Li-Chen Chen, Zhubei (TW)

(73) Assignee: KNOWLES ELECTRONICS, LLC, Itasca, IL (US)

(*) Notice: Subject to any disclaimer, the term of this patent is extended or adjusted under 35 U.S.C. 154(b) by 65 days.

(21) Appl. No.: 17/222,053

(22) Filed: Apr. 5, 2021

(65) Prior Publication Data
US 2022/0321986 A1 Oct. 6, 2022

(51) Int. Cl.
*H04R 1/00* (2006.01)
*H04R 1/08* (2006.01)
*B81B 3/00* (2006.01)
*B81B 7/00* (2006.01)

(52) U.S. Cl.
CPC ........... *H04R 1/083* (2013.01); *B81B 3/0021* (2013.01); *B81B 3/0067* (2013.01); *B81B 7/0029* (2013.01); *B81B 2201/0257* (2013.01)

(58) Field of Classification Search
CPC ..... H04R 1/083; B81B 3/0021; B81B 3/0067; B81B 7/0029; B81B 2201/0257
See application file for complete search history.

(56) References Cited

U.S. PATENT DOCUMENTS

| 4,154,115 A | 5/1979 | Hartung et al. |
| 4,435,986 A | 3/1984 | Choffat |
| 6,075,867 A | 6/2000 | Bay et al. |
| 6,431,003 B1 | 8/2002 | Stark et al. |
| 6,435,033 B2 | 8/2002 | Delaye |
| 6,535,460 B2 | 3/2003 | Loeppert et al. |
| 6,571,445 B2 | 6/2003 | Ladabaum |
| 6,662,663 B2 | 12/2003 | Chen |

(Continued)

FOREIGN PATENT DOCUMENTS

| CN | 103344377 A | 10/2013 |
| KR | 100571967 B1 | 4/2006 |
| WO | 2012085335 A1 | 6/2012 |

OTHER PUBLICATIONS

Andrews et al., "A comparison of squeeze-film theory with measurements on a microstructure," Sensors and Actuators A 36 (1993) 79-87, 9 pages.

(Continued)

*Primary Examiner* — Matthew A Eason
(74) *Attorney, Agent, or Firm* — Flener IP & Business Law; Zareefa B. Flener

(57) ABSTRACT

A MEMS die includes a substrate having an opening formed therein, and a diaphragm attached around a periphery thereof to the substrate and over the opening, wherein the diaphragm comprises first and second spaced apart layers. A backplate is disposed between the first and second spaced apart layers. One or more columnar supports are disposed through holes disposed through the backplate and connecting the first and second spaced apart layers. At least a partial vacuum exists between at least a portion of the first and second spaced apart layers. The first layer further comprises interior and exterior sub-layers at least proximate to each of the one or more columnar supports, wherein the interior sub-layers include one or more apertures disposed therethrough.

20 Claims, 4 Drawing Sheets

(56) References Cited

U.S. PATENT DOCUMENTS

| | | |
|---|---|---|
| 7,030,407 B2 | 4/2006 | Michler |
| 7,040,173 B2 | 5/2006 | Dehe |
| 7,124,638 B2 | 10/2006 | Kandler |
| 7,150,195 B2 | 12/2006 | Jacobsen et al. |
| 7,190,038 B2 | 3/2007 | Dehe et al. |
| 7,470,546 B2 | 12/2008 | Lehmann |
| 7,489,593 B2 | 2/2009 | Nguyen-Dinh et al. |
| 7,535,156 B2 | 5/2009 | Kvisteroy et al. |
| 7,545,012 B2 | 6/2009 | Smith et al. |
| 7,781,249 B2 | 8/2010 | Laming et al. |
| 7,793,550 B2 | 9/2010 | Elian et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,903,831 B2 | 3/2011 | Song |
| 7,918,135 B2 | 4/2011 | Hammerschmidt |
| 8,127,619 B2 | 3/2012 | Hammerschmidt |
| 8,339,764 B2 | 12/2012 | Steeneken et al. |
| 8,461,655 B2 | 6/2013 | Klein et al. |
| 8,575,037 B2 | 11/2013 | Friza et al. |
| 8,650,963 B2 | 2/2014 | Barr et al. |
| 8,723,277 B2 | 5/2014 | Dehe et al. |
| 8,809,973 B2 | 8/2014 | Theuss |
| 8,969,980 B2 | 3/2015 | Lee |
| 8,989,411 B2 | 3/2015 | Hall et al. |
| 9,031,266 B2 | 5/2015 | Dehe et al. |
| 9,179,221 B2 | 11/2015 | Barzen et al. |
| 9,181,080 B2 | 11/2015 | Dehe et al. |
| 9,237,402 B2 | 1/2016 | Loeppert |
| 9,321,630 B2 | 4/2016 | Xu et al. |
| 9,332,330 B2 | 5/2016 | Elian et al. |
| 9,380,381 B2 | 6/2016 | Straeussnigg et al. |
| 9,383,282 B2 | 7/2016 | Besling et al. |
| 9,383,285 B2 | 7/2016 | Phan et al. |
| 9,425,757 B2 | 8/2016 | Straeussnigg et al. |
| 9,432,759 B2 | 8/2016 | Elian et al. |
| 9,438,979 B2 | 9/2016 | Dehe |
| 9,510,107 B2 | 11/2016 | Dehe et al. |
| 9,516,428 B2 | 12/2016 | Dehe et al. |
| 9,549,263 B2 | 1/2017 | Uchida |
| 9,550,211 B2 | 1/2017 | Dirksen et al. |
| 9,631,996 B2 | 4/2017 | Wiesbauer et al. |
| 9,689,770 B2 | 6/2017 | Hammerschmidt |
| 9,828,237 B2 | 11/2017 | Walther et al. |
| 9,884,757 B2 | 2/2018 | Winkler et al. |
| 9,903,779 B2 | 2/2018 | Hammerschmidt |
| 9,942,677 B2 | 4/2018 | Wiesbauer et al. |
| 10,129,676 B2 | 11/2018 | Walther et al. |
| 10,231,061 B2 | 3/2019 | Dehe et al. |
| 10,322,481 B2 | 6/2019 | Dehe et al. |
| 10,433,070 B2 | 10/2019 | Dehe et al. |
| 10,560,771 B2 | 2/2020 | Dehe et al. |
| 10,582,306 B2 | 3/2020 | Dehe |
| 10,589,990 B2 | 3/2020 | Dehe et al. |
| 10,641,626 B2 | 5/2020 | Bretthauer et al. |
| 10,669,151 B2 | 6/2020 | Strasser et al. |
| 10,676,346 B2 | 6/2020 | Walther et al. |
| 10,689,250 B2 | 6/2020 | Fueldner et al. |
| 10,715,926 B2 | 7/2020 | Bretthauer et al. |
| 10,939,214 B2 | 3/2021 | Kuntzman et al. |
| 2005/0177045 A1 | 8/2005 | Degertekin et al. |
| 2005/0207605 A1 | 9/2005 | Dehe et al. |
| 2005/0219953 A1 | 10/2005 | Bayram et al. |
| 2007/0205492 A1 | 9/2007 | Wang |
| 2007/0278501 A1 | 12/2007 | Macpherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0170346 A1 | 7/2010 | Opitz et al. |
| 2010/0173437 A1 | 7/2010 | Wygant et al. |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2013/0001550 A1 | 1/2013 | Seeger et al. |
| 2014/0071642 A1 | 3/2014 | Theuss |
| 2015/0090043 A1 | 4/2015 | Ruhl et al. |
| 2015/0247879 A1 | 9/2015 | Meinhold |
| 2015/0296307 A1 | 10/2015 | Shao et al. |
| 2016/0096726 A1 | 4/2016 | Dehe et al. |
| 2018/0091906 A1 | 3/2018 | Khenkin et al. |
| 2018/0234774 A1 | 8/2018 | Walther et al. |
| 2018/0317022 A1 | 11/2018 | Evans et al. |
| 2019/0071305 A1 * | 3/2019 | Strasser ................. H04R 19/04 |
| 2019/0112182 A1 | 4/2019 | Metzger-Brueckl et al. |
| 2019/0181776 A1 | 6/2019 | Tumpold et al. |
| 2019/0246459 A1 | 8/2019 | Tumpold et al. |
| 2019/0270639 A1 | 9/2019 | Lorenz et al. |
| 2019/0331531 A1 | 10/2019 | Glacer et al. |
| 2019/0339193 A1 | 11/2019 | Eberl et al. |
| 2019/0352175 A1 | 11/2019 | Tumpold et al. |
| 2019/0352176 A1 * | 11/2019 | Doller .................. B81B 7/0048 |
| 2019/0363757 A1 | 11/2019 | Mikolajczak et al. |
| 2020/0057031 A1 | 2/2020 | Theuss et al. |

OTHER PUBLICATIONS

Bay et al., "Design of a silicon microphone with differential read-out of a sealed double parallel-plate capacitor," Sensors and Acutators A 53 (1996), pp. 232-236, 5 pages.

Hansen et al., "Wideband micromachined capacitive microphones with radio frequency detection," J. Acoust. Soc. Am. 116 (2), Aug. 2004, pp. 828-842, 15 pages.

Lin, Der-Song, "Interface Engineering of Capacitive Micromachined Ultrasonic Transducers for Medical Applications," A Dissertation Submitted to the Depailment of Mechanical Engineering and the Committee on Graduate Studies of Stanford University in Partial Fulfillment of the Requirements for the Degree of Doctor of Philosophy, Jun. 2011, 168 pages.

Park et al., "Fabrication of Capacitive Micromachined Ultrasonic Transducers via Local Oxidation and Direct Water Bonding," Journal of Microelectromechanical Systems, vol. 20, No. 1, Feb. 2011, 10 pages.

Krzysztof Iniewski, "Smart Sensors for Industrial Applications," Figure 19. 1, p. 306, 1 page (2013).

Wygant et al., "50 kHz Capacitive Micromachined Ultrasonic Transducers for Generation of Highly Directional Sound with Parametric Arrays," IEEE Transactions on Ultrasonics, Ferroelectrics, and Frequency Control, vol. 56, No. 1, Jan. 2009, pp. 193-203, 11 pages.

* cited by examiner

SEALED VACUUM MEMS DIE

FIELD OF THE DISCLOSURE

The present disclosure relates generally to a microelectromechanical systems (MEMS) die, and more particularly to MEMS die having an internal space that is under vacuum and sealed.

BACKGROUND

It is known that in the fabrication of MEMS devices often a plurality of devices are manufactured in a single batch process wherein individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes use as an acoustic transducer or other portion of a microphone.

MEMS dies having a vacuum sealed between two or more layers are known. However, problems exist with the currently known process for manufacturing such dies and further with the quality of the dies thereby produced. Problems with known manufacturing processes include incomplete or uneven release of sacrificial material from between the layers, which can result in excess material remaining between the layers. Such excess material can have a detrimental effect on the performance of a device ultimately made from the die, for example, by interfering with the motion of the layers or otherwise degrading the response of the layers to external stimuli. Further problems with known processes include inadequate sealing of the vacuum between the layers after the sacrificial material has been released, and the unintended addition of stresses to the layers by the presence of sealing structures disposed thereon. A need therefore exists for a process that can be used in making a MEMS die having a vacuum sealed between two or more layers that provides an adequate seal for the space between the layers without adding unwanted stress to the layers or leaving behind excess material in the sealed vacuum between the layers. It would be beneficial if such a process could further be easily manufacturable to reduce complexity, and therefore cost and time of production.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

Figure 1:
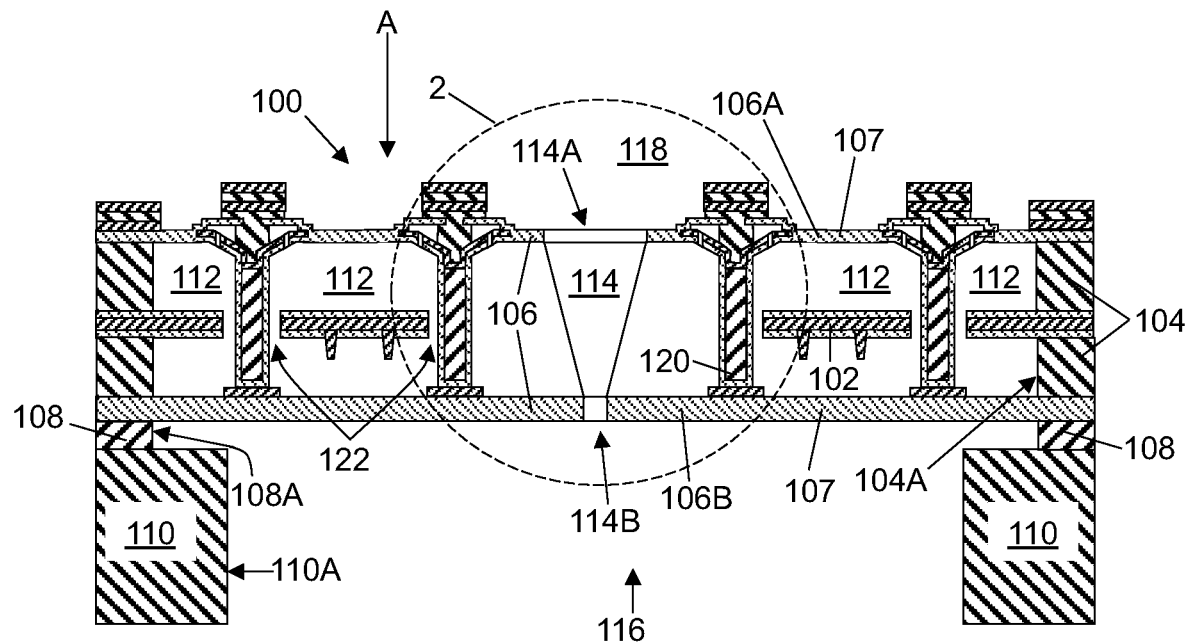
FIG. 1 is a cross-sectional schematic view of a MEMS die, according to an embodiment.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

A MEMS diaphragm for example, for an acoustic transducer, can be a single monolithic layer of material or can be made from two or more layers of material. In some embodiments, the diaphragm is made from two or more layers of material containing a sealed space therebetween that is sealed under vacuum. Such a structure having a vacuum between the layers can provide an improvement in performance by removing the effect of air damping that would otherwise be caused by air trapped between the layers.

In some embodiments, a multi-layered MEMS diaphragm containing a vacuum between the layers is structured to include exterior diaphragm layers, for example top and bottom layers, that are connected by a supporting structure to inhibit collapse or deformation of the exterior diaphragm layers due to external air pressure. In such an embodiment a backplate layer is disposed between the exterior diaphragm layers so that the backplate layer is fixed and the exterior diaphragm layers move relative to the fixed backplate layer.

According to an embodiment, a MEMS die includes a substrate having an opening formed therein, and a diaphragm attached around a periphery thereof to the substrate and over the opening, wherein the diaphragm comprises first and second spaced apart layers. A backplate is disposed between the first and second spaced apart layers. One or more columnar supports are disposed through holes disposed through the backplate and connecting the first and second spaced apart layers. At least a partial vacuum exists between at least a portion of the first and second spaced apart layers. The first layer further comprises interior and exterior sub-layers at least proximate to each of the one or more columnar supports, wherein the interior sub-layers include one or more apertures disposed therethrough.

According to an embodiment, a microphone device includes a microelectromechanical system (MEMS) acoustic transducer, comprising a substrate having an opening formed therein, and a diaphragm attached around a periphery thereof to the substrate and over the opening, wherein the diaphragm comprises first and second spaced apart layers. A backplate is disposed between the first and second spaced apart layers. One or more columnar supports are disposed through holes disposed through the backplate and connecting the first and second spaced apart layers. At least a partial vacuum exists between at least a portion of the first and second spaced apart layers. The first layer further comprises interior and exterior sub-layers at least proximate to each of the one or more columnar supports, wherein the interior sub-layers include one or more apertures disposed therethrough. The microphone device further includes a base having a first surface, an opposing second surface, and a port, wherein the port extends between the first surface and the second surface. An integrated circuit (IC) is disposed on the first surface of the base. The MEMS acoustic transducer is also disposed on the first surface of the base. A cover is disposed over the first surface of the base covering the MEMS acoustic transducer and the IC.

In an embodiment, a MEMS die includes a diaphragm comprising first and second spaced apart layers, a first pierce disposed through the first layer and a second pierce disposed through the second layer, wherein the first and second pierces are in fluid communication. In another embodiment, a backplate is disposed between the first and second spaced apart layers and one or more columnar supports are disposed through holes disposed through the backplate and connecting the first and second spaced apart layers. The MEMS die further comprises interior and exterior sub-layers at least proximate to each of the one or more columnar supports, wherein the interior sub-layer includes one or more apertures disposed therethrough, and wherein the one or more apertures are configured as one or more holes arranged proximate to the one or more columnar supports.

Turning to FIG. 1, a MEMS die according to an embodiment is shown schematically in cross-section. The MEMS die, generally labelled 100, includes a substrate 110 having an opening 116 formed therein. In an embodiment the substrate 110 is an annulus but in other embodiments it can be any shape. In an embodiment the diaphragm 106 is attached around a periphery thereof to the substrate 110 and over the opening 116 (via the optional spacer 108 shown in FIG. 1). In some embodiments the spacer 108 that can be an integral part of the substrate 110 or added onto the substrate 110 as an additional layer 108 that functions to extend the substrate 110 to provide support for the diaphragm 106. In an embodiment the substrate 110 is made of Silicon.

In an embodiment the diaphragm 106 comprises first and second spaced apart layers 106A and 106B. In an embodiment, a backplate 102 is disposed between the first and second spaced apart layers 106A and 106B. In an embodiment the backplate 102 is attached around a periphery thereof to spacers 104 disposed between the first and second spaced apart layers 106A and 106B. In an embodiment, both the diaphragm 106 and the backplate 102 are circular in a top plan view (as viewed along the arrow labeled A in FIG. 1) but in other embodiments can be any shape.

In an embodiment the optional spacer 108 has a curved interior wall 108A. The diaphragm 106 is fully constrained (by the optional second spacer 108 and the spacers 104) along a boundary that is defined by a curve along which the interior wall 104A of the spacer 104 meets the diaphragm 106. The substrate 110 also has a curved interior wall 110A, which defines the opening 116 that extends through the substrate 110 to the surrounding environment. In an embodiment, the spacers 104 and the optional spacer 108 are part of the sacrificial material of the MEMS die 100, for example, the same material comprising the plug 140 described hereinbelow, and the walls 104A and 108A of the spacers are made from a time-limited etch front of the sacrificial material. In another embodiment the spacers 104 and the optional spacer 108 are made of the insulative material 109 as further described hereinbelow.

In an embodiment at least a portion 112 of the space between the first and second spaced apart layers 106A and 106B is sealed from the environment, and at least a partial vacuum exists in the sealed portion 112. However, in an embodiment, at least one passage 114 is disposed entirely through the diaphragm 106 providing fluid communication between the opening 116 and an opposite side 118 of the diaphragm 106. In an embodiment a first pierce 114A of any cross-sectional shape as is desired or otherwise known in the art is disposed through the first layer 106A and a second pierce 114B of any cross-sectional shape as is desired or otherwise known in the art is disposed through the second layer 106B, wherein the first and second pierces 114A and 114B are in fluid communication. One or more columnar supports 120 are disposed through holes 122 disposed through the backplate 102 and connecting the first and second spaced apart layers 106A and 106B.

The passage 114 allows for pressure equalization between the opposite side 118 of the diaphragm 106 and the surrounding environment. The passage 114 is important for Low Frequency Roll-Off (LFRO) performance of the transducer, and in some embodiments there can be more than one passage 114 disposed through the diaphragm 106.

Figure 2:
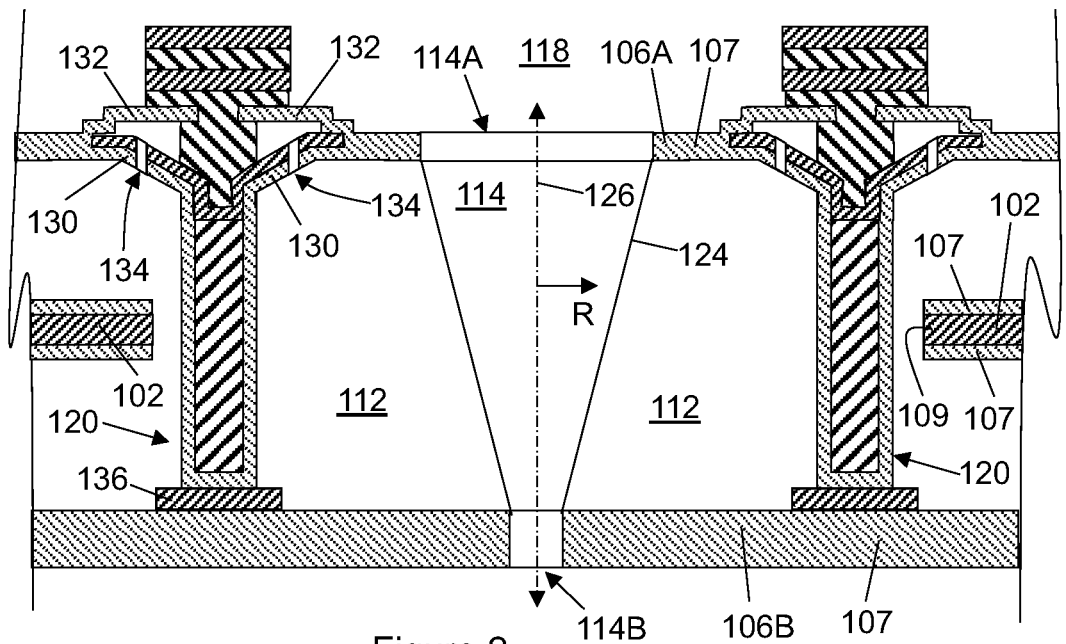
FIG. 2 is a cross-sectional schematic view of the MEMS die of FIG. 1, illustrating an expanded view of the portion of FIG. 1 within the dashed ellipse 2.

Referring now to FIG. 2, a portion of FIG. 1 within the dashed ellipse 2 is shown somewhat expanded. A centerline 126 and a radial axis R have been added for reference of the following description. In an embodiment a boundary 124 is disposed between the at least one passage 114 and the sealed portion 112 of the space between the first and second spaced apart layers 106A and 106B. The boundary 124 maintains the sealed portion 112 while allowing for fluid communication between the first and second pierces 114A and 114B. The boundary 124 shown schematically in FIG. 2 represents a sealing barrier wall and may comprise one or more layers of sealing material as described further hereinbelow.

Still referring to FIG. 2, in an embodiment the first layer 106A of the diaphragm 106 further comprises interior 130 and exterior 132 sub-layers at least proximate to each of the one or more columnar supports 120, wherein the interior sub-layer 130 includes one or more apertures 134 disposed therethrough. The one or more apertures 134 are disposed through the interior sub-layer 130 so as to be in fluid communication with the opening 138 in the absence of the plug 140 (see FIG. 3). The one or more apertures 134 as will be described more fully hereinbelow provide an escape path for sacrificial material to be released from the MEMS die 100 during manufacture.

By locating the one or more apertures 134 through the interior sub-layer 130 that is at least proximate to each of the one or more columnar supports 120, post-release sealing structures (as described further hereinbelow) can be located on top of the one or more columnar supports 120. This structure provides an advantage over known multi-layer MEMS vacuum diaphragms which have release apertures and associated sealing structures on a surface of the diaphragm where such release apertures can leave excess sacrificial material on an inside of the diaphragm, and further where such sealing structures can detrimentally cause an undesirable stress concentration on the surface of the diaphragm. Locating the apertures 134 and the associated post-release sealing structures to near the tops of the columnar supports 120 solves both these issues.

Referring now to FIGS. 1 and 2, in an embodiment each of the first and second spaced apart layers 106A and 106B, and the interior 130 and exterior 132 sub-layers comprises at least a conductive layer of material 107. In an embodiment the backplate 102 comprises a conductive material 107 facing both of the first and second spaced apart layers. In an embodiment the backplate 102 comprises a layer of insulative material 109 disposed between at least partial layers of conductive material 107. The structural geometry of materials comprising the first and second layers 106A and 106B and the backplate 102 can be other than those described hereinabove in other embodiments.

In terms of particular material types the insulative material 109 can be any insulative material as known in the art that would not be damaged during a sacrificial layer removal process. For example, without limitation, the insulative material 109 can be Silicon Nitride, Silicon Oxynitride, metal oxides, materials that are not damaged by a sacrificial layer removal process, and combinations thereof.

Similarly, the conductive material 107 can be any conductive material as known in the art that would not be damaged during a sacrificial layer removal process. For example, without limitation, the conductive material 107 can be Polycrystalline Silicon, one or more metals, alloys of metals, carbon, materials that are not damaged by a sacrificial layer removal process, and combinations thereof.

Figure 3:
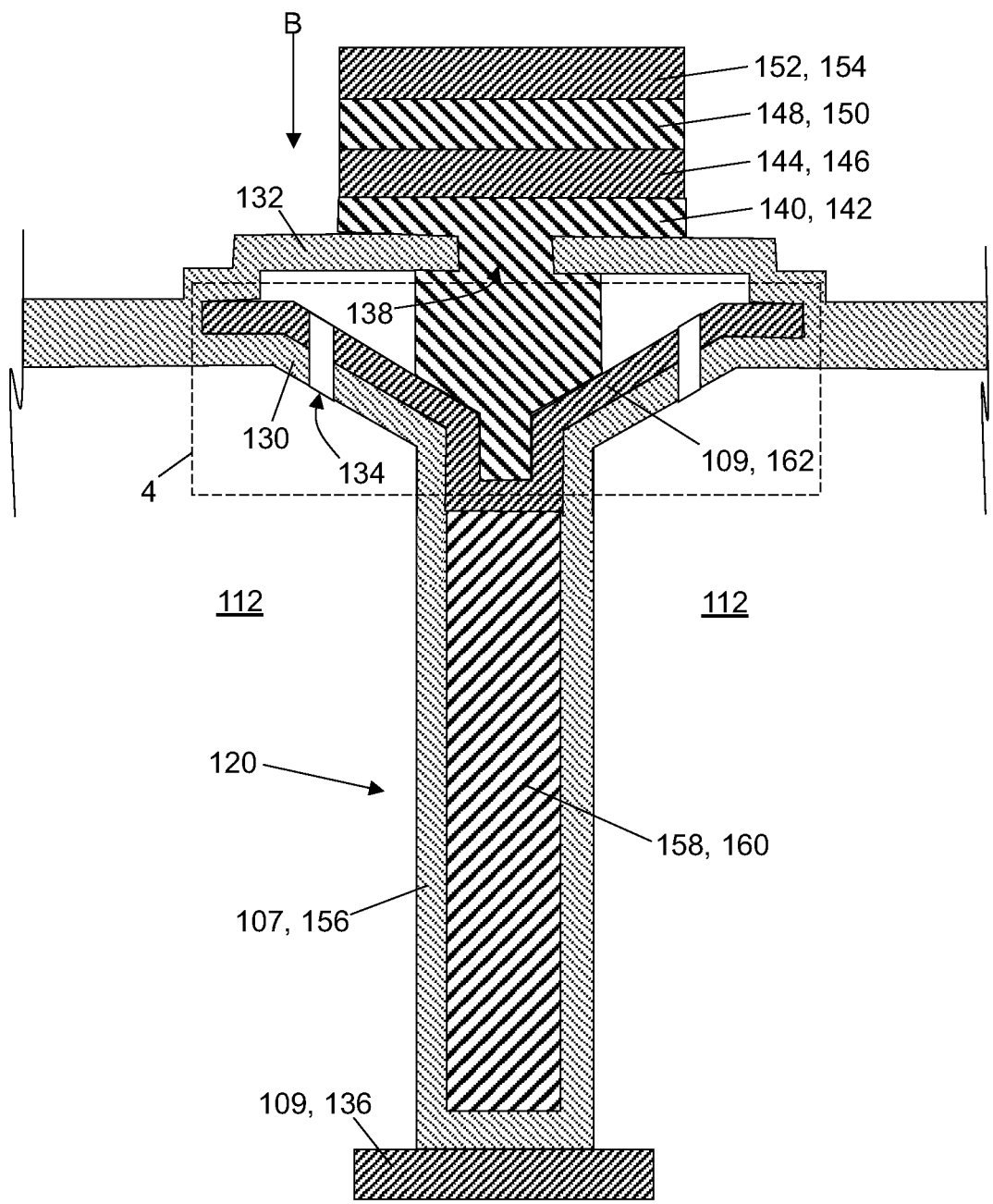
FIG. 3 is a cross-sectional schematic view of a columnar support according to an embodiment.

Referring now to FIG. 3, a columnar support 120 is illustrated including some of the structures contacting the columnar support 120. In an embodiment, each of the one or more columnar supports 120 comprises a layer 136 of insulative material 109 as described above connecting to the columnar support 120 to the second layer 106B. In an embodiment each of the one or more columnar supports 120 further includes an exterior sub-layer 132 of the first layer 106A disposed over an end of the columnar support 120. The exterior sub-layer 132 comprises an opening 138 disposed therethrough such that the opening 138 is aligned with the columnar support 120. For example as illustrated in FIG. 3 the opening 138 is disposed directly over an end of the column support 120.

In an embodiment the opening 138 is covered and filled by a plug 140 of a first sealing material 142. The first sealing material 142 can be any sealing material as known in the art that can be removed by dry or wet base sacrificial layer release tools. For example, without limitation, the first sealing material 142 can be Silicon Oxide, polyimide, materials that can be removed by dry or wet base sacrificial release tools, and combinations thereof. In an embodiment the plug 140 of the first sealing material 142 is further covered by at least a layer 144 of a second sealing material 146. The second sealing material 146 can be any material as described above for the first sealing material 142 and can be the same as or different from the first sealing material 142. For example, in an embodiment the plug 140 and the layer 144 are made from two different sealing materials.

As shown in FIG. 3, more than 2 layers (which include the plug 140 and the layer 144) can be applied to seal the opening 138. In some embodiments, another layer 148 of a third sealing material 150 is disposed over the layer 144. In further embodiments still another layer 152 of a fourth sealing material 154 is disposed over the layer 148. The third and fourth sealing materials 150, 154 can be any material as described above for the first sealing material 142 and can be the same as or different from the first sealing material 142, the second sealing material 146 and each other. For example, in an embodiment the plug 140 and the layer 144 are made from two different sealing materials, and the layers 148 and 152 are made from the same two sealing materials, respectively. Other embodiments can utilize other combinations of sealing materials; however, without being held to any particular theory the actual layers of material used matter less than the layered structure. Multiple layers disposed on top of one another is effective in preventing gas and humidity from penetrating therethrough thus maintaining a level of vacuum in the space 112 within the diaphragm 106.

In an embodiment, each of the columnar supports 120 has an exterior portion 156 comprised of a conductive material 107, which can be but isn't necessarily be the same type of conductive material 107 as used for the diaphragm first and second layers 106A and 106B. An interior portion 158 of each of the columnar supports 120 in an embodiment comprises a fill material 160 as known in the art, and that may be, for example without limitation, Silicon Oxide. A cover portion 162 of each columnar support 120 disposed between the plug 140 and the interior portion 158 and overlying the interior sub-layer 130 comprises a layer of insulative material 109 as described above. The one or more apertures 134 disposed through the interior sub-layer 130 are also disposed through the cover layer 162.

Figure 4:
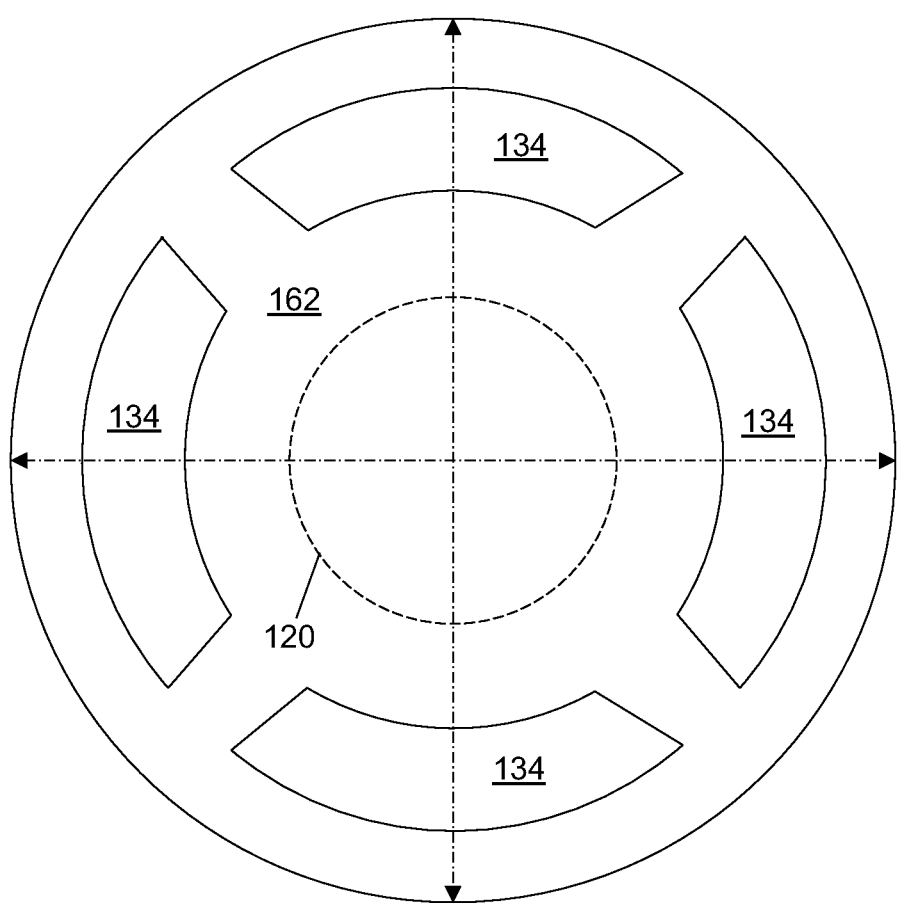
FIG. 4 illustrates an exemplary geometry of the one or more apertures disposed through the cover layer and through the interior sub-layer of the first layer of the diaphragm according to an embodiment.

Referring now to FIG. 4, a portion of FIG. 3 within the dashed rectangle 42 is illustrated (as viewed from above along the arrow labeled B in FIG. 3). In an embodiment the one or more apertures 134 are configured as one or more discontinuous circumferentially elongate slots 134 that are arranged to be concentric with the one or more columnar supports 120. In other embodiments the one or more apertures 134 are configured as one or more discontinuous slots that are arranged around the one or more columnar supports 120, but that are not necessarily concentric therewith. In a further embodiment, the one or more apertures 134 are simply one or more holes of any shape or cross-sectional geometry that are arranged around or proximate to the one or more columnar supports 120 but are not necessarily concentric therewith.

During operation of the MEMS die 100, for example as an acoustic transducer 100, electric charge is applied to the conductive layer of the backplate 102 and to the conductive layers 106A and 106B of the diaphragm 106 thereby inducing an electric field between the backplate 102 and the layers 106A and 106B of the diaphragm 106 and creating an electrostatic bias on the layers 106A and 106B of the diaphragm 106. Movement of the air (e.g., resulting from sound waves) pushes against the outer surface of the diaphragm 106 facing the opening 116 causing the layers 106A and 106B of the diaphragm 106 to deflect (enter a deflection state) and to deform. This deformation causes a change in the capacitance between the backplate 102 and the layers 106A and 106B of the diaphragm 106 which can be detected and interpreted as sound.

Figure 5:
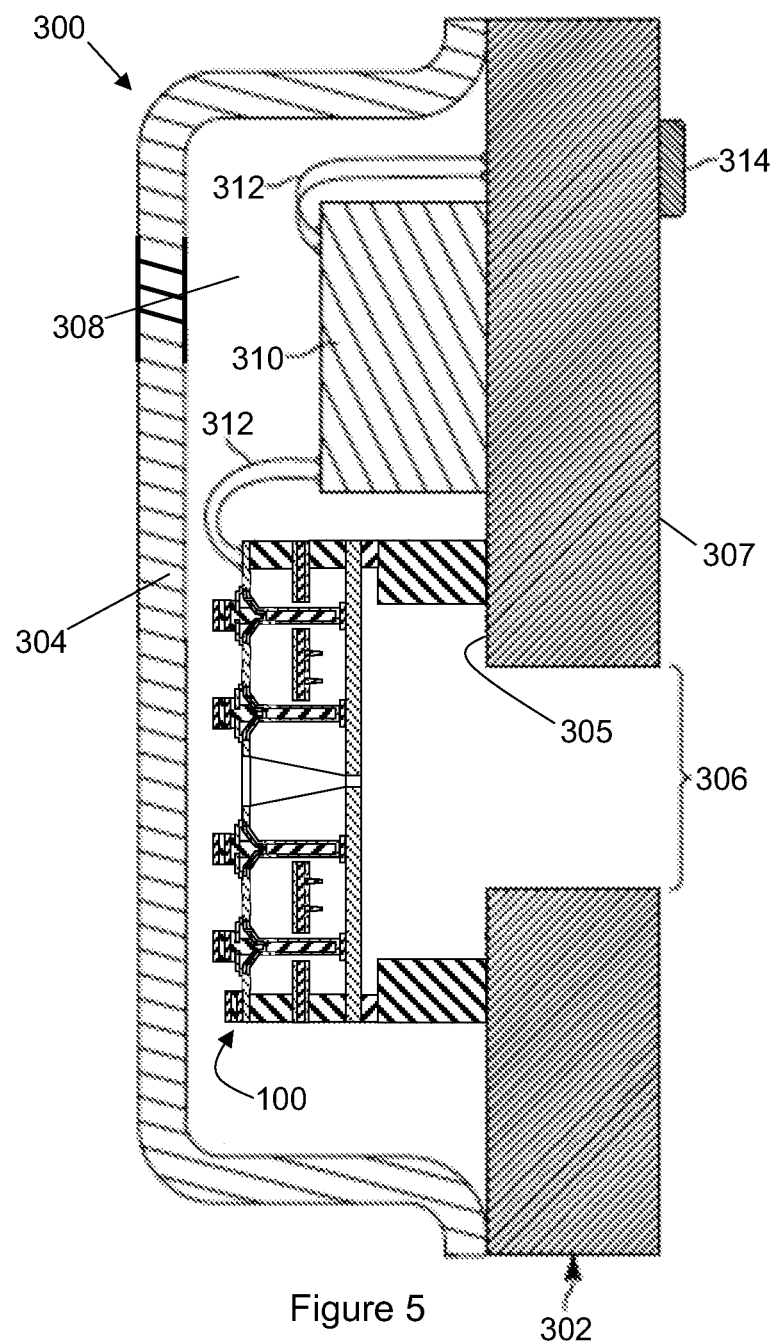
FIG. 5 is a cross-sectional view of a microphone assembly according to an embodiment.

Turning to FIG. 5, the MEMS die 100 used as an acoustic transducer 100 is configured to fit within a microphone assembly, generally labeled 300. The assembly 300 includes a housing including a base 302 having a first surface 305 and an opposing second surface 307. The housing further includes a cover 304 (e.g., a housing lid), and an acoustic port 306. In an embodiment the port 306 extends between the first surface 305 and the second surface 307. In one implementation, the base 302 is a printed circuit board. The cover 304 is coupled to the base 302 (e.g., the cover 304 may be mounted onto a peripheral edge of the base 302). Together, the cover 304 and the base 302 form an enclosed volume 308 for the assembly 300.

As shown in FIG. 5, the acoustic port 306 is disposed on the base 302 and is structured to convey sound waves to the MEMS acoustic transducer 100 located within the enclosed volume 308. In other implementations, the acoustic port 306 is disposed on the cover 304 and/or a side wall of the cover 304. In some embodiments, the assembly 300 forms part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

The assembly 300 includes an electrical circuit disposed within the enclosed volume 308. In an embodiment, the electrical circuit includes an integrated circuit (IC) 310. In an embodiment the IC 310 is disposed on the first surface 305 of the base 302. The IC 310 may be an application specific integrated circuit (ASIC). Alternatively, the IC 310 may include a semiconductor die integrating various analog, analog-to-digital, and/or digital circuits. In an embodiment the cover 304 is disposed over the first surface 305 of the base 302 covering the MEMS acoustic transducer 100 and the IC 310.

In the assembly 300 of FIG. 5, the MEMS acoustic transducer 100 is illustrated as being disposed on the first surface 305 of the base 302. The MEMS acoustic transducer 100 converts sound waves, received through acoustic port 306, into a corresponding electrical microphone signal, and generates an electrical signal (e.g., a voltage) at a transducer output in response to acoustic activity incident on the port 306. As shown in FIG. 5, the transducer output includes a pad or terminal of the transducer that is electrically connected to the electrical circuit via one or more bonding wires 312. The assembly 300 of FIG. 5 further includes electrical contacts, shown schematically as contacts 314, typically disposed on a bottom surface of the base 302. The contacts 314 are electrically coupled to the electrical circuit. The contacts 314 are configured to electrically connect the assembly 300 to one of a variety of host devices.

As noted hereinabove, a plurality of MEMS devices can be manufactured in a single batch process. Individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes as an acoustic transducer or other portion of a microphone.

Steps in a production process utilized to produce the MEMS die 100 as described hereinabove include etching, masking, patterning, cutting, boring, and/or release steps executed on a workpiece as are known in the art of producing layered MEMS devices. Accordingly, all of the steps are not described in detail herein. However, generally the portions of the MEMS die 100 that ultimately end up as the sealed portion 112 are layered onto the workpiece using sacrificial material, and are covered by the conductive material 107 that ultimately comprises the first spaced apart layer 106A and the interior sub-layer 130 thereof. Material for the cover layer 162 is applied over regions above the columnar posts 120 and the one or more apertures 134 as described hereinabove are created through the material of the cover layer 162 and the interior sub-layer 130. Next, the sacrificial material disposed beneath the material of the first spaced apart layer 106A and the interior sub-layer 130 is released as is known in the art through the one or more apertures 134 and the opening 138. At this point in the production process, the workpiece is exposed to a desired level of vacuum during application of at least the layers 140 and 144 of material as described hereinabove over the openings 138 to seal and maintain vacuum within the sealed portion 112.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical system (MEMS) die, comprising:
   a substrate having an opening formed therein;
   a diaphragm attached around a periphery thereof to the substrate and over the opening, wherein the diaphragm comprises first and second spaced apart layers;
   a backplate disposed between the first and second spaced apart layers; and
   one or more columnar supports disposed through holes disposed through the backplate and connecting the first and second spaced apart layers; wherein
   at least a partial vacuum exists between at least a portion of the first and second spaced apart layers; and wherein
   the first layer further comprises interior and exterior sub-layers at least proximate to each of the one or more columnar supports, wherein each interior sub-layer includes one or more apertures disposed therethrough; and
   wherein each exterior sub-layer is disposed over an end of one of the one or more columnar supports and further comprises an opening disposed therethrough that is aligned with the one of the one or more columnar supports.

2. The MEMS die of claim 1, wherein each of the one or more columnar supports comprises a layer of insulative material connecting to the second layer.

3. The MEMS die of claim 1, wherein each of the first and second spaced apart layers comprises at least a conductive layer and the backplate comprises conductive material facing both of the first and second spaced apart layers.

4. The MEMS die of claim 3, wherein the backplate comprises a layer of insulative material disposed between at least partial layers of conductive material.

5. The MEMS die of claim 4, wherein the insulative material is selected from the group of materials consisting of Silicon Nitride, Silicon Oxynitride, metal oxides, materials that are not damaged by a sacrificial layer removal process, and combinations thereof.

6. The MEMS die of claim 3, wherein the conductive layers and the conductive material are selected from the group of materials consisting of Polycrystalline Silicon, one or more metals, alloys of metals, carbon, materials that are not damaged by a sacrificial layer removal process, and combinations thereof.

7. The MEMS die of claim 1, wherein the opening is covered and filled by a plug of a first sealing material.

8. The MEMS die of claim 7, wherein the first sealing material is selected from the group of materials consisting of Silicon Oxide, polyimide, materials that can be removed by dry or wet base sacrificial release tools, and combinations thereof.

9. The MEMS die of claim 7, wherein the plug of the first sealing material is further covered by at least a layer of a second sealing material.

10. The MEMS die of claim 9, wherein the second sealing material is selected from the group of materials consisting of Silicon Oxide, polyimide, materials that can be removed by dry or wet base sacrificial release tools, and combinations thereof.

11. The MEMS die of claim 1, further comprising a first pierce disposed through the first layer and a second pierce disposed through the second layer, wherein the first and second pierces are in fluid communication.

12. The MEMS die of claim 1, wherein the one or more apertures are configured as one or more holes arranged proximate to the one or more columnar supports.

13. A microphone device, comprising:
 a base having a first surface, an opposing second surface, and a port, wherein the port extends between the first surface and the second surface;
 an integrated circuit (IC) disposed on the first surface of the base;
 the MEMS die of claim 1 disposed on the first surface of the base; and
 a cover disposed over the first surface of the base covering the MEMS die and the IC.

14. A microphone device, comprising:
 a microelectromechanical system (MEMS) acoustic transducer, comprising:
  a substrate having an opening formed therein;
  a diaphragm attached around a periphery thereof to the substrate and over the opening, wherein the diaphragm comprises first and second spaced apart layers;
  a backplate disposed between the first and second spaced apart layers; and
  one or more columnar supports disposed through holes disposed through the backplate and connecting the first and second spaced apart layers; wherein
  at least a partial vacuum exists between at least a portion of the first and second spaced apart layers; and wherein
  the first layer further comprises interior and exterior sub-layers at least proximate to each of the one or more columnar supports, wherein each interior sub-layer includes one or more apertures disposed therethrough; and
  wherein each exterior sub-layer is disposed over an end of one of the one or more columnar supports and further comprises an opening disposed therethrough that is aligned with the one of the one or more columnar supports.

15. The microphone device of claim 14, further comprising;
 a base having a first surface, an opposing second surface, and a port, wherein the port extends between the first surface and the second surface; and
 an integrated circuit (IC) disposed on the first surface of the base; wherein
 the MEMS acoustic transducer is disposed on the first surface of the base; and
 a cover is disposed over the first surface of the base covering the MEMS acoustic transducer and the IC.

16. The microphone device of claim 14, wherein each of the first and second spaced apart layers comprises at least a conductive layer and the backplate comprises a layer of insulative material disposed between at least partial layers of conductive material.

17. The microphone device of claim 14, wherein each of the one or more columnar supports comprises a layer of insulative material connecting to the second layer.

18. The microphone device of claim 14, wherein the opening is covered and filled by a plug of a first sealing material, and wherein the plug of the first sealing material is further covered by at least a layer of a second sealing material.

19. The microphone device of claim 14, further comprising a first passage disposed through the first layer and a second passage disposed through the second layer, wherein the first and second passages are in fluid communication.

20. The microphone device of claim 14, wherein the one or more apertures are configured as one or more holes arranged proximate to the one or more columnar supports.

* * * * *